(12) United States Patent
Metcalf (10) Patent No.: US 10,568,231 B1
(45) Date of Patent: Feb. 18, 2020

(54) POWER SUPPLY AND DISTRIBUTION SKID FRAMES FOR DATA CENTERS

(71) Applicant: Equinix, Inc., Redwood City, CA (US)

(72) Inventor: Gregory Metcalf, San Francisco, CA (US)

(73) Assignee: Equinix, Inc., Redwood City, CA (US)

( * ) Notice: Subject to any disclaimer, the term of this patent is extended or adjusted under 35 U.S.C. 154(b) by 326 days.

(21) Appl. No.: 15/441,097

(22) Filed: Feb. 23, 2017

Related U.S. Application Data (60) Provisional application No. 62/441,107, filed on Dec. 30, 2016.

(51) Int. Cl.
*H05K 7/14* (2006.01)
*H05K 7/18* (2006.01)
*G06F 1/3287* (2019.01)

(52) U.S. Cl.
CPC ......... *H05K 7/1492* (2013.01); *G06F 1/3287* (2013.01); *H05K 7/1489* (2013.01); *H05K 7/1497* (2013.01); *H05K 7/183* (2013.01)

(58) Field of Classification Search
CPC .. H05K 7/1492; H05K 7/1497; H05K 7/1489; H05K 7/183; G06F 1/3287
See application file for complete search history.

(56) References Cited

U.S. PATENT DOCUMENTS

| | | | | |
|---|---|---|---|---|
| 8,681,479 B2 * | 3/2014 | Englert | ................ | H05K 7/1457 174/50 |
| 8,990,639 B1 | 3/2015 | Marr et al. | | |
| 9,165,120 B1 | 10/2015 | Brandwine et al. | | |
| 9,219,384 B2 | 12/2015 | Emert et al. | | |
| 9,337,688 B2 | 5/2016 | Englert et al. | | |
| 9,431,798 B2 * | 8/2016 | Englert | ................ | H05K 7/1492 |
| 9,519,517 B2 | 12/2016 | Dalgas et al. | | |
| 2006/0193252 A1 | 8/2006 | Naseh et al. | | |
| 2006/0271544 A1 | 11/2006 | Devarakonda et al. | | |
| 2009/0144393 A1 | 6/2009 | Kudo | | |
| 2010/0057935 A1 | 3/2010 | Kawai et al. | | |
| 2010/0211669 A1 | 8/2010 | Dalgas et al. | | |
| 2012/0290135 A1 | 11/2012 | Bentivegna et al. | | |
| 2013/0198354 A1 | 8/2013 | Jone et al. | | |
| 2015/0012566 A1 | 1/2015 | Cartwright et al. | | |
| 2015/0036266 A1 | 2/2015 | Emert et al. | | |
| 2016/0337473 A1 | 11/2016 | Rao | | |

* cited by examiner

*Primary Examiner* — Jared Fureman
*Assistant Examiner* — Michael J Warmflash
(74) *Attorney, Agent, or Firm* — Shumaker & Sieffert, P.A.

(57) ABSTRACT

A system apparatus and method for providing electrical power to multiple customer devices within a data center that includes a power supply skid frame having a top portion and a bottom portion, a power supply portion physically separate from the power supply skid frame and capable of being positioned on the top portion of the power supply skid frame to supply the electrical power, a power distribution skid frame, mechanically and electrically separate from the power supply skid frame, having a top portion and a bottom portion, and a power distribution portion physically separate from the power distribution skid frame and capable of being positioned on the top portion of the power distribution skid frame to distribute the electrical power. The system may include one or more skid frame spacer bars, physically separate from the power supply skid frame and the power distribution skid frame and capable of mechanically coupling the power supply skid frame and the power distribution skid frame.

23 Claims, 9 Drawing Sheets

POWER SUPPLY AND DISTRIBUTION SKID FRAMES FOR DATA CENTERS

This application claims the benefit of U.S. Provisional Application Ser. No. 62/441,107, filed Dec. 30, 2016, the entire content of which is incorporated herein by reference.

TECHNICAL FIELD

The invention relates to data centers and, more specifically, to power supply and distribution skid frames for a data center.

BACKGROUND

A co-location facility provider (a "provider") may employ a communication facility, such as a data center or warehouse, in which multiple customers of the provider locate network, server, and storage gear, and interconnect to a variety of telecommunications, cloud, and other network service provider(s) with a minimum of cost and complexity. Such co-location facilities may be shared by the multiple customers. Co-location facilities provide space, power, cooling, and physical security for the server, storage, and networking equipment for multiple customers, providing the customers with reduced costs and complexity. By using co-location facilities of the provider, customers of the provider including telecommunications providers, Internet Service Providers (ISPs), application service providers, service providers, content providers, and other providers, as well as enterprises, enjoy less latency and the freedom to focus on their core business.

As the number of customers joining a co-location facility and individual customer capacity demands from the co-location facility increase, the ability of co-location facility providers to be able to quickly and efficiently adjust and spread capacity across a much wider customer field becomes more significant.

SUMMARY

In general, techniques are described for mechanically and electrically separate power supply and power distribution skid frames and for providing redundant power distribution skid frames to incrementally and more quickly address increases in required power distribution as the number of customers and/or the load associated with the number of customer devices within a data center increase. In one example of the disclosure, a system for providing electrical power to multiple customer devices within a data center comprises a power supply skid frame having a top portion and a bottom portion; a power supply portion physically separate from the power supply skid frame and capable of being positioned on the top portion of the first power supply skid frame to supply the electrical power; a power distribution skid frame, mechanically and electrically separate from the power supply skid frame, having a top portion and a bottom portion; and a power distribution portion physically separate from the power distribution skid frame and capable of being positioned on the top portion of power distribution skid frame. The system may include one or more skid frame spacer bars, physically separate from the power supply skid frame and the power distribution skid frame and capable of mechanically coupling the power supply skid frame and the power distribution skid frame.

By allocating the power supply portion including power supply components for data center equipment electrical power supply to the power supply skid frame and allocating the power distribution portion including power distribution components for data center equipment electrical power distribution to the power distribution skid frame, multiple redundant power distribution skid frame may be incrementally deployed within the data center and coupled to a power supply skid frame as the power distribution needs within a data center increase but the power supply needs within the data center do not support an additional power supply portion and power supply skid frame.

In one example, an apparatus for providing electrical power to multiple customer devices within a data center comprises a power supply skid frame having a top portion and a bottom portion; a power supply portion physically separate from the power supply skid frame and capable of being positioned on the top portion of the power supply skid frame to generate the electrical power; and one or more skid frame spacer bars, mechanically separate from the power supply skid frame, and capable of being mechanically coupled to the power supply skid frame.

In another example, an apparatus for providing electrical power to multiple customer devices within a data center comprises a power distribution skid frame having a top portion and a bottom portion; a power distribution portion physically separate from the power distribution skid frame and capable of being positioned on the top portion of power distribution skid frame; and one or more skid frame spacer bars, mechanically separate from the power distribution skid frame, and capable of being mechanically coupled to the power distribution skid frame.

In another example, a system for providing electrical power to multiple customer devices within a data center comprises a power supply skid frame having a top portion and a bottom portion; a power supply portion physically separate from the power supply skid frame and capable of being positioned on the top portion of the first power supply skid frame to supply the electrical power; a first power distribution skid frame, mechanically and electrically separate from the power supply skid frame, having a top portion and a bottom portion; and a first power distribution portion physically separate from the power distribution skid frame and capable of being positioned on the top portion of the first power distribution skid frame. The system may include one or more skid frame spacer bars, physically separate from the power supply skid frame and the first power distribution skid frame and capable of mechanically coupling the power supply skid frame and the first power distribution skid frame. In addition, the system may include a second power distribution skid frame having a top portion and a bottom portion, and a second power distribution portion capable of being position on the top portion of the second power distribution skid frame and being electrically coupled to the power supply portion to further distribute the generated power to the computing devices, wherein the second power distribution skid frame is not mechanically coupled to the power supply skid frame or to the first power distribution skid frame.

In another example, a method of providing electrical power to multiple customer devices within a data center comprises positioning a power supply skid frame having a top portion and a bottom portion within a data center; positioning a power distribution skid frame having a top portion and a bottom portion within the data center; mechanically coupling the power supply skid frame and power distribution skid frame with one or more skid frame spacer bars; and electrically coupling a power supply portion positioned on the top portion of the power supply skid frame and a power distribution portion positioned on the top portion of the power distribution skid frame.

In another example, a method of providing electrical power to multiple customer devices within a data center comprises positioning a power supply skid frame having a top portion and a bottom portion within a data center; positioning a first power distribution skid frame having a top portion and a bottom portion within the data center; mechanically coupling the power supply skid frame and the first power distribution skid frame with one or more skid frame spacer bars, electrically coupling a power supply portion positioned on the top portion of the power supply skid frame and a first power distribution portion positioned on the top portion of the first power distribution skid frame; positioning a second power distribution skid frame having a top portion and a bottom portion within the data center; and electrically coupling the power supply portion positioned on the top portion of the power supply skid frame and a second power distribution portion positioned on the top portion of the second power distribution skid frame via the first power distribution skid frame, wherein the second power distribution skid frame is not mechanically coupled to the power supply skid frame or to the first power distribution skid frame.

The details of one or more examples are set forth in the accompanying drawings and the description below. Other features, objects, and advantages of the disclosure will be apparent from the description and drawings, and from the claims.

BRIEF DESCRIPTION OF DRAWINGS

Like reference numerals refer to like elements throughout the figures and text.

DETAILED DESCRIPTION

A co-location facility may offer a range of cloud computing solutions to co-location facility customers. Cloud computing refers to the use of dynamically scalable computing resources accessible via a network, such as the Internet. Computing resources, often referred to as a "cloud," provide one or more services to users. These services may be categorized according to service types, which may include, for example, applications/software, platforms, infrastructure, virtualization, and servers and data storage. The names of service types are often prepended to the phrase "as-a-Service" such that the delivery of applications/software and infrastructure, as examples, may be referred to as Software-as-a-Service (SaaS) and Infrastructure-as-a-Service (IaaS), respectively. The co-location facility may also be known as a data center, an interconnection facility, or a communication facility.

The term "cloud-based services" or, more simply, "services" refers not only to services provided by a cloud, but also to a form of service provisioning in which customer contract with service providers for the online delivery of services provided by the cloud. Service providers manage a public, private, or hybrid cloud to facilitate the online delivery of services to one or more customers. In some instances, multiple customers and service providers may have physical and/or logical network interconnections at co-location facility points that provide for high-speed transmission of information between the customers and service providers.

A co-location facility provider ("provider") employs network infrastructure within a co-location facility that enables customers to connect, using interconnections established within the network infrastructure by the provider, to one another to receive and transmit data for varied purposes. For instance, a co-location facility may provide data transport services for one or more cloud-based services. The co-location facility in this way offers customers connectivity to a vibrant ecosystem of additional customers including content providers, Internet service providers, carriers, and enterprises. Customers of the co-location facility may connect for such end-uses as service delivery, content delivery, financial services, and Internet access, to give just a few examples.

A co-location facility may offer products such as a cage, a cabinet, and power to its customers, for example. A co-location facility may also offer products relating to interconnection, such as cross-connect and virtual circuits. As a result, a co-location facility may be more than just a carrier hotel that provides off-site storage to its customers.

As used herein, the term "customer" of the co-location facility provider, or "co-location facility user", may refer to a tenant of at least one co-location facility employed by the co-location facility provider. A customer may lease space within the co-location facility in order to co-locate with other tenants for improved efficiencies over independent facilities, as well as to interconnect network equipment with the other tenants/customers' network equipment within the co-location facility or campus. A customer may desire co-locating with other tenants for reduced latency/jitter and improved reliability, performance, and security versus transport networks, among other reasons. A co-location facility typically hosts numerous customers and their network, server, and/or storage gear. Each customer may have particular reasons for choosing a co-location facility, including capacity, geographical proximity, connecting to other customers, co-locating with other customers, and price.

A co-location facility may provide one or more different types of interconnections between customer networks for customers co-located in the co-location facility. For instance, a co-location facility may provide physical or "layer-1" (in the Open Systems Interconnection model (OSI Model)) interconnections between co-location facility users. Physical interconnections may include physical cross-connects that are established by category 5 or 6 (cat 5/6) cables, coaxial cables, and/or fiber optic cables, for instance. In some examples, a co-location facility may provide data link or "layer-2" (in the OSI Model) interconnections between co-location facility users. In some examples, a co-location facility that provides layer-2 interconnections may be referred to as an Ethernet Exchange, where Ethernet is the underlying layer-2 protocol. In some examples, a co-location facility may provide network and/or transfer or "layer-3/4" (in the OSI Model) interconnections between co-location facility users. In some examples, a co-location facility that providers layer-3/4 interconnections may be referred to an Internet Exchange, where TCP/IP are the underlying layer-3/4 protocols. For example, a co-location facility that provides an Internet Exchange may allow customer routers to directly peer with one another using a layer-3 routing protocol, such as Border Gateway Protocol, to exchange routes for facilitating layer-3 traffic exchange to provide private peering. In some examples, a co-location facility may provide indirect layer-3 routing protocol peering whereby each customer announces its layer-3 routes to an autonomous system (AS) deployed by the co-location facility provider within the co-location facility network infrastructure to provide private peering mediated by the AS. The AS may then relay these routes in conjunction with tunneling or other forwarding information to establish an interconnection between customers. In some examples, a co-location facility that provides indirect layer-3 routing protocol peering to facilitate service traffic exchange in this way may be referred to as a Cloud-based Services Exchange or, more simply, a Cloud Exchange. Additional description of exchanges are found in U.S. application Ser. No. 15/001, 766, filed Jan. 20, 2016, entitled "MULTI-CLOUD, MULTI-SERVICE DATA MODEL," the entire content of which is incorporated by reference herein.

In some examples, a "connection" may be a physical or logical coupling between a co-location facility user in a customer or provider network and a co-location facility point. An "interconnection" may be a physical or logical coupling between connections that couple at least two co-location facility users. As such, a network infrastructure configuration within a co-location facility that enables customer networks to connect to exchange data may be referred to herein as an "interconnection." A cross-connect interconnection may refer to a physical coupling between two co-location facility customer networks. An Ethernet interconnection may be a layer 2 coupling between two co-location facility customer networks via ports of the co-location facility. An Internet exchange interconnection may be a layer-3/4 coupling between two co-location facility customer networks via ports of the co-location facility. The foregoing examples of co-location facilities and interconnections are exemplary only and many other types of co-location facilities and interconnections are possible.

Figure 1:
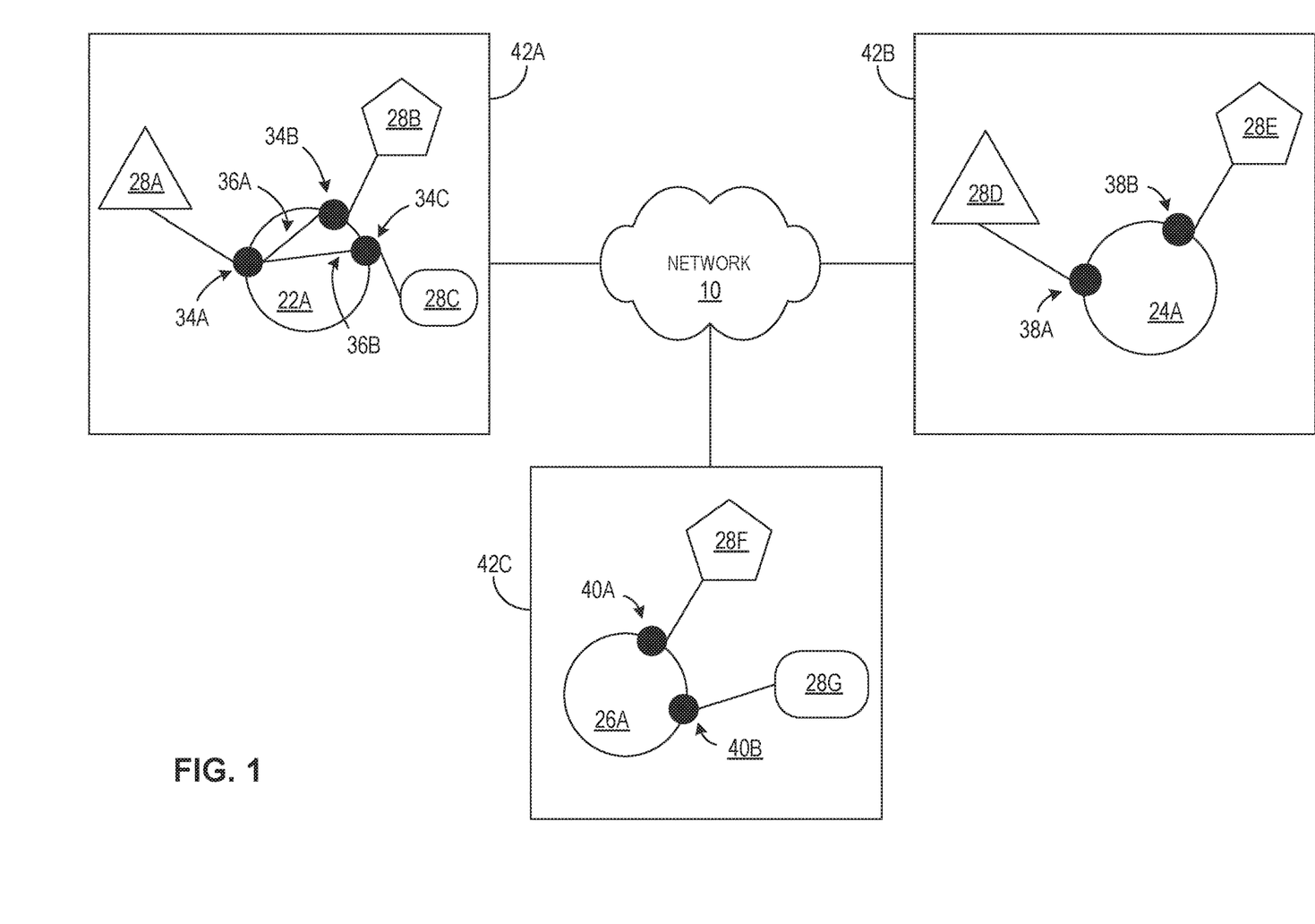
FIG. 1 is a conceptual diagram illustrating the interconnections between one or more co-location facility users at co-location facilities, in accordance with one or more techniques of the disclosure.

FIG. 1 is a conceptual diagram illustrating interconnections between one or more co-location facility users at co-location facilities, in accordance with one or more techniques of the disclosure. FIG. 1 illustrates multiple geographically distributed co-location facilities 42A, 42B, and 42C. Each of co-location facilities 42A-42C may be separated by a distance of 50 miles or more in some examples. As shown in FIG. 1, co-location facility 42A includes a co-location facility network 22A. Similarly, co-location facility 42B includes a co-location facility network 24A, and co-location facility 42C includes a co-location facility network 26A. In some examples, co-location facilities 42A-42C represent a metro-based interconnection exchange made up of multiple co-location facilities within a single metropolitan area.

In the example of FIG. 1, co-location facility network 22A includes connections 34A-34C by co-location facility users (or "customers") 28A-28C. For instance, co-location facility user 28A may represent a system or network of the user that is coupled to co-location facility network 22A by connection 34A. Similarly, co-location facility user 28B may be a system or network of the user that is coupled to co-location facility network 22A by connection 34B. Co-location facility user 28C may be a system or network of the user that is coupled to co-location facility network 22A by connection 34C. FIG. 1 further illustrates two interconnections 36A and 36B. Interconnection 36A may be a physical or logical coupling between connections 34A and 34B that couple co-location facility user 28A to co-location facility user 28B. Interconnection 36B may be a physical or logical coupling between connections 34A and 34C that couple co-location facility user 28A to co-location facility user 28C.

In the same way, co-location network 24A of co-location facility 42B may include connections 38A and 38B by co-location facility users 28D and 28E, and co-location network 26A of co-location facility 42C may include connections 40A and 40B by co-location facility users 28F and 28G.

As described above, a cross-connect interconnection may refer to a physical coupling (e.g., fiber or Cat5/6 cable between two network devices and/or systems of co-location facility users). An Ethernet interconnection may be a layer-2 coupling between two co-location facility users, such as one or more Virtual Local Area Networks (VLANs) or other logical networks providing L2 reachability. An Internet exchange interconnection may be a layer-3/4 coupling between two co-location facility users, such as a layer-3 network path provided by an Internet Exchange. In some examples, an interconnection may be a virtual circuit established at least in part within a co-location facility. The interconnections described herein may include at least one of a physical cross-connect, a virtual Ethernet connection providing a layer 2 forwarding path, a direct layer 3 peering arrangement to establish an end-to-end layer 3 forwarding path (e.g., using a layer 3 VPN), and an indirect layer 3 peering arrangement to establish an end-to-end layer 3 forwarding path (e.g., using a layer 3 VPN). As used herein, the phrase "at least one of A and B" encompasses A, B, or A and B, regardless of whether A and B represent singular items, categories, or collections. Customers may establish multiple interconnections over a single physical port. For example, a customer may exchange data via a L2 interconnection with a first cloud service provider and via a L3 interconnection with a second cloud service provider, both the L2 and L3 interconnections operating over a single customer port for the customer. In some examples, an enterprise customer may have multiple interconnections, operating over a single port, with multiple different cloud service providers to receive cloud-based services.

Figure 2:
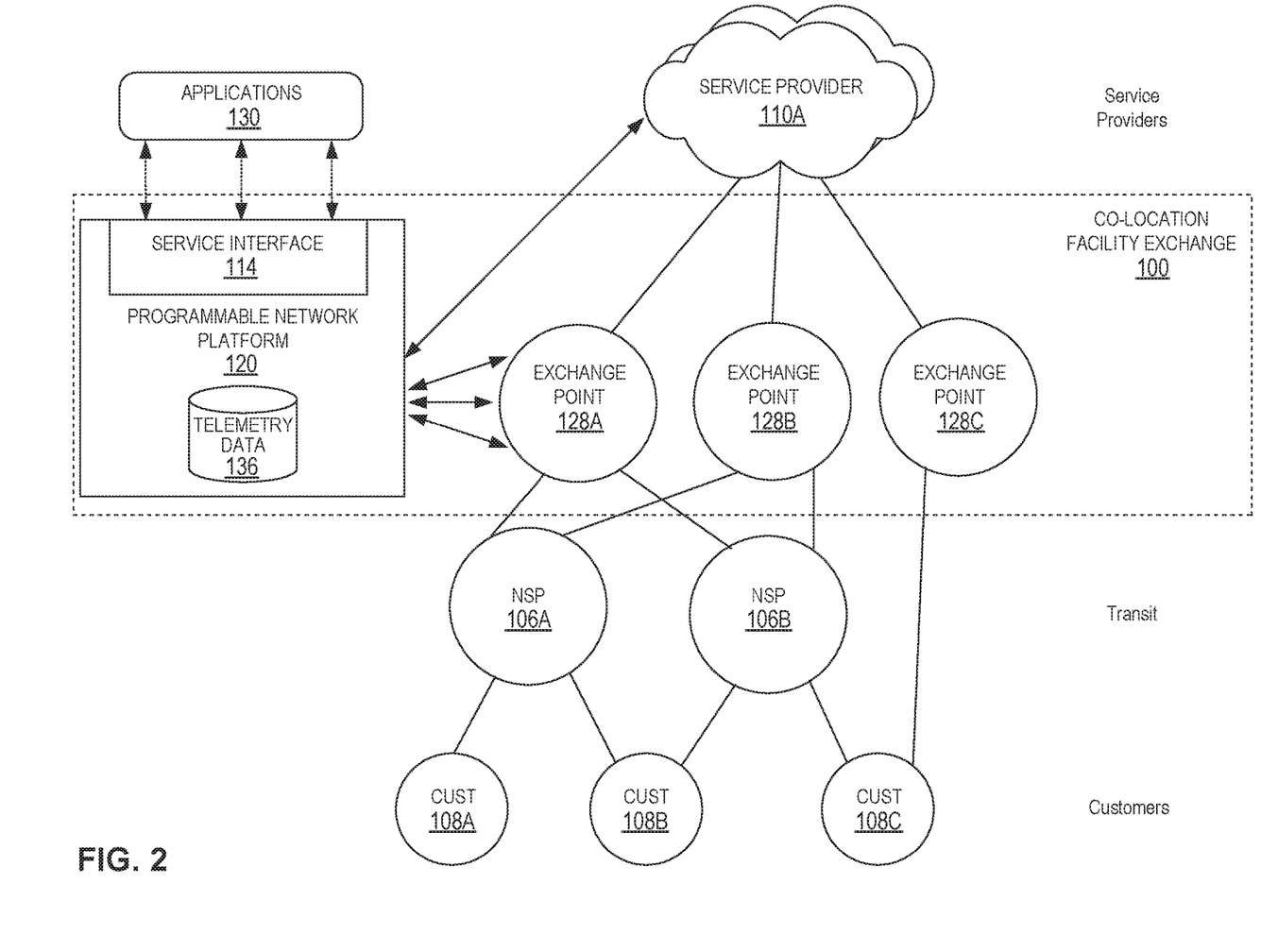
FIG. 2 illustrates a conceptual view of a network system providing metro-based interconnection in which multiple co-location facility points located in a metropolitan area enable interconnection, and a magnetic score engine determines customer importance to co-location facilities, according to techniques described herein.

FIG. 2 illustrates a conceptual view of a network system providing metro-based interconnection in which multiple co-location facility points located in a metropolitan area enable interconnection according to techniques described herein. FIG. 2 depicts one embodiment of co-location facility exchange 100 and the interconnections between service providers 110 and customers 108. For instance, metro-based co-location facility exchange 100 may enable customers 108A-108C ("customers 108") to bypass the public Internet to directly connect to services providers 110A-110N ("SPs 110" or "service providers 110") so as to improve performance, reduce costs, increase the security and privacy of the connections, and leverage cloud computing for additional applications. The multiple SPs 110 participate in the co-location facility by virtue of their having at least one accessible port in the co-location facility by which a customer can connect to the one or more services offered by the SPs 110, respectively. According to various examples described herein, metro-based co-location facility exchange 100 may allow private networks of any customer to be directly cross-connected to any other customer at a common point, thereby allowing direct exchange of network traffic between the networks of the customers. Customers may include network carriers 106A-106B (collectively, "NSPs 106," or alternatively, "carriers 106"), enterprises, and other users of services offered by one or more service providers.

Each of co-location facility exchange points 128A-128C (illustrated as "exchange points" and described alternatively herein as "co-location facility points" or "exchange points"; collectively referred to as "co-location facility points 128") of metro-based co-location facility exchange 100 (alternatively, "metro 100") may represent a different data center geographically located within the same metropolitan area ("metro-based," e.g., in New York City, N.Y.; Silicon Valley, Calif.; Seattle-Tacoma, Wash.; Minneapolis-St. Paul, Minn.; London, UK; etc.) to provide resilient and independent co-location facilities by which customers and service providers connect to receive and provide, respectively, services. In other words, co-location facility exchange 100 may include multiple co-location facilities geographically located within a metropolitan area. In some examples, each of the multiple co-location facilities geographically located with a metropolitan area may have low-latency links that connect the multiple co-location facilities in a topology to provide metro-based interconnection services between customers receiving interconnection services at different co-location facilities in the metro-based interconnect facility hub. In various examples, metro-based co-location facility exchange 100 may include more or fewer co-location facility points 128. In some instances, metro-based interconnection exchange 100 may include just one co-location facility exchange point 128. A co-location facility provider may deploy instances of co-location facility exchange 100 in multiple different metropolitan areas, each instance of metro-based co-location facility exchange 100 having one or more co-location facility exchange points 128. As such, a co-location facility exchange point 128 is a co-location facility that includes an exchange by which multiple customers co-located within the co-location facility may interconnect to exchange services and data.

Each of co-location facility exchange points 128 includes network infrastructure and an operating environment by which customers 108 receive services from multiple SPs 110. As noted above, an interconnection may refer to, e.g., a physical cross-connect, an Ethernet connection such as a Layer 2 VPN or virtual private LAN (e.g., E-LINE, E-LAN, E-TREE, or E-Access), an Internet exchange-based interconnection in which respective routers of interconnected customers directly peer and exchange layer 3 routes for service traffic exchanged via the metro-based co-location facilities exchange 100, and a cloud exchange in which customer routers peer with metro-based co-location facilities exchange 100 (or "provider") routers rather than directly with other customers.

For interconnections at layer-3 or above, customers 108 may receive services directly via a layer 3 peering and physical connection to one of co-location facility exchange points 128 or indirectly via one of NSPs 106. NSPs 106 provide "transit" by maintaining a physical presence within one or more of co-location facility exchange points 128 and aggregating layer 3 access from one or customers 108. NSPs 106 may peer, at layer 3, directly with one or more co-location facility exchange points 128 and in so doing offer indirect layer 3 connectivity and peering to one or more customers 108 by which customers 108 may obtain services from the metro-based co-location facility hub 100.

In instances in which co-location facility exchange points 128 offer a cloud exchange, each of co-location facility exchange points 128, in the example of FIG. 2, is assigned a different autonomous system number (ASN). For example, co-location facility exchange point 128A is assigned ASN 1, co-location facility exchange point 128B is assigned ASN 2, and so forth. Each co-location facility exchange point 128 is thus a next hop in a path vector routing protocol (e.g., BGP) path from service providers 110 to customers 108. As a result, each co-location facility exchange point 128 may, despite not being a transit network having one or more wide area network links and concomitant Internet access and transit policies, peer with multiple different autonomous systems via external BGP (eBGP) or other exterior gateway routing protocol in order to exchange, aggregate, and route service traffic from one or more service providers 110 to customers. In other words, co-location facility exchange points 128 may internalize the eBGP peering relationships that service providers 110 and customers 108 would maintain on a pair-wise basis. Instead, a customer 108 may configure a single eBGP peering relationship with a co-location facility exchange point 128 and receive, via the co-location facility, multiple services from one or more service providers 110. While described herein primarily with respect to eBGP or other layer 3 routing protocol peering between co-location facility points and customer, NSP, or service provider networks, the co-location facility points may learn routes from these networks in other way, such as by static configuration, or via Routing Information Protocol (RIP), Open Shortest Path First (OSPF), Intermediate System-to-Intermediate System (IS-IS), or other route distribution protocol.

As examples of the above, customer 108C is illustrated as having contracted with the co-location facility provider for metro-based co-location facility hub 100 to directly access layer 3 services via co-location facility exchange point 128C and also to have contracted with NSP 106B to access layer 3 services via a transit network of the NSP 106B. Customer 108B is illustrated as having contracted with multiple NSPs 106A, 106B to have redundant access to co-location facility exchange points 128A, 128B via respective transit networks of the NSPs 106A, 106B. The contracts described above are instantiated in network infrastructure of the co-location facility exchange points 128 by L3 peering configurations within switching devices of NSPs 106 and co-location facility exchange points 128 and L3 connections, e.g., layer 3 virtual circuits, established within co-location facility exchange points 128 to interconnect service provider 110 networks to NSPs 106 networks and customer 108 networks, all having at least one port offering connectivity within one or more of the co-location facility exchange points 128.

As shown in FIG. 2, programmable network platform 120 may include telemetry data 136. Telemetry data 136 may include metrics about the quantity, type, strength, intensity, and definition of network and resource configurations that are configured by programmable network platform 120. Telemetry data 136 may include analytics information from infrastructure data collectors based on raw metrics data for resources used in a particular service.

In some examples, telemetry data 136 may include information that indicates connections of co-location facility users to co-location facility points. For instance, a co-location facility user may include a service customer or service provider. In some examples, a connection may be a physical or logical (e.g., L2 or L3) coupling between a co-location facility user in a user network (e.g., customer network or provider network) and a co-location facility point. Telemetry data 126 may include information that indicates interconnections between co-location facility users at a co-location facility point. In some examples, an interconnection may be a physical or logical coupling between at least two co-location facility users in a co-location facility point.

Figure 3:
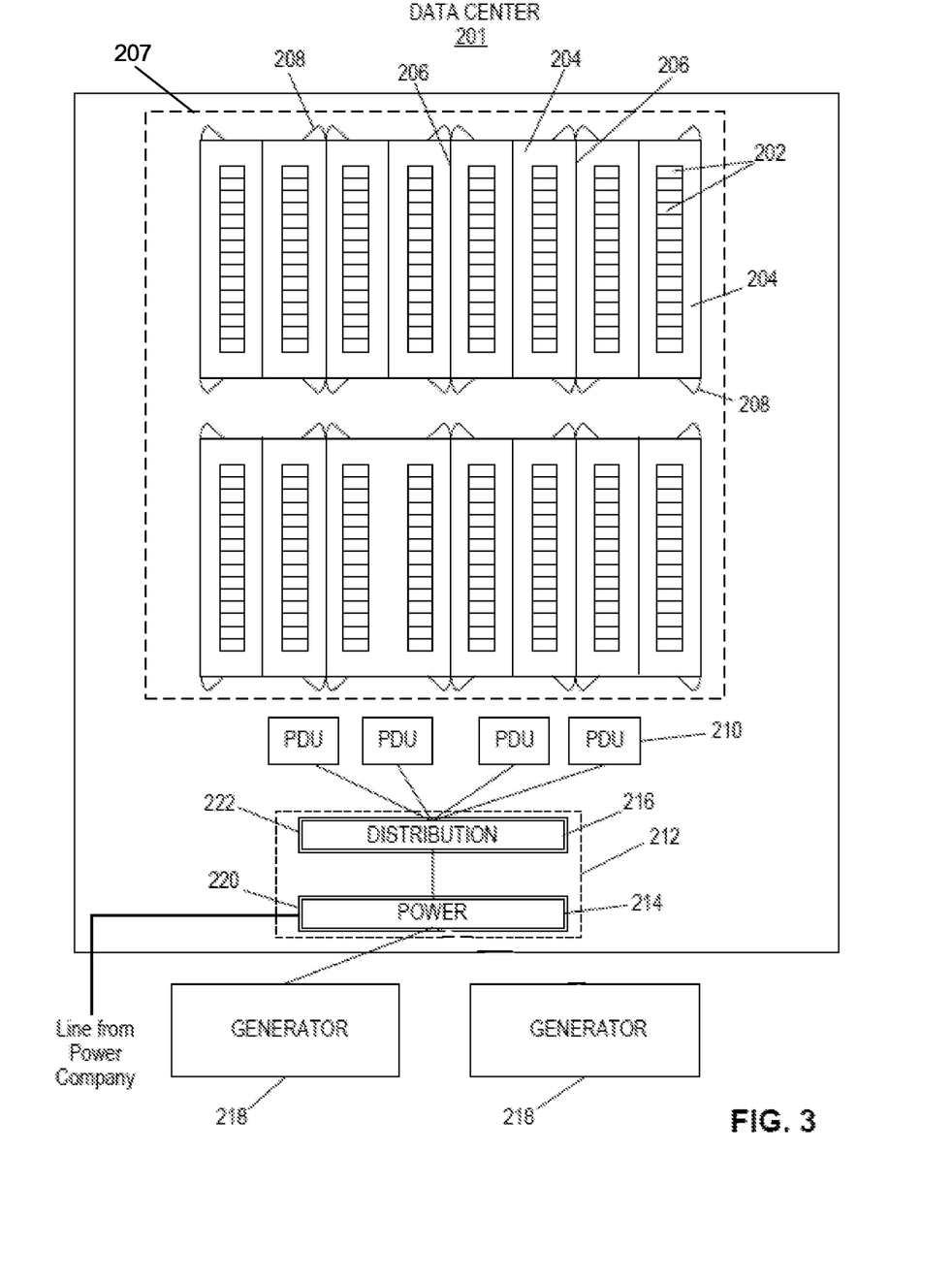
FIG. 3 is a block diagram of an example data center, in accordance with techniques of the disclosure.

FIG. 3 is a block diagram of an example data center, in accordance with techniques of the disclosure. In some examples, data center 201 provides an operating environment for a co-location facility. As described above, a network services exchange provider or co-location provider (a "provider") may employ data center 201, in which multiple customers of the provider locate network, server, and storage gear and interconnect to a variety of telecommunications and other network service provider(s) with a minimum of cost and complexity. Data centers may be shared by the multiple tenants locating networking equipment within the data centers. Data center 201 in some cases may be used by a single tenant or may be employed by a single enterprise to house and operate its computing equipment.

Data center 201 may include a storage volume storing numerous electronic devices that produce heat, including network, server, and storage gear, as well as power distribution components for distributing power to devices within the facility, for example, as will be described below in detail. As illustrated in FIG. 3, in one example, data center 201 may include multiple racks or dedicated server spaces 202 positioned within multiple cages 204 of data center 201. Cages 204 may be separated by walls 206, with each cage 204 being accessible through one or more designated entrance 208, with a number of cages 204 being included within a hall 207. Each entrance 208 may be secured, and each of cages 204 may be occupied by one or more customers. Power is provided to racks 202 within cages 204 via one or more power distribution units 210 (PDUs) electrically coupled to a power distribution module 212. Cages 204 and racks 202 may share power and cooling infrastructure with other data center tenants, or have these resources provided on a dedicated basis. Each of racks 202 include one or more computing devices, such as network devices, server computers, and storage devices, that require power that is supplied by the data center provider to computing devices.

As illustrated in FIG. 3, power distribution module 212 may include one or more blocks for providing power to customers. In one example, each block may include one or more power supply portion 214 positioned on a power supply skid frame 220 in combination with one or more power distribution portion 216 positioned on a power distribution skid frame 222, as will be described below in detail. Power supply portion 214 may receive electrical power from an external electrical power company or from a generator 218 and provides electrical power to data center 201, and distribution portion 216 may distribute the supplied power from power supply portion 214 to one or more racks 202 within cages 204 to power electronic operation of racks 202.

Data center 201 is typically a raised floor facility so that power cables, conduit, and connections may be positioned to extend under power distribution module 212, PDUs 210, cages 204 and racks 202, as will be described below. Data center 201 may include one or more generators 218 so that one of the generators 218 associated with the hall 207 may automatically be engaged in the event that utility power to the one or more power supply portions 214 of power distribution module 212 is interrupted. As a result, having both the one or more power supply portions 214 capable of receiving power supply from an outside power supply source company or one of generators 218 provides the data center 201 with varying levels of power redundancy.

Power supply portion 214 may in some examples not include any electrical components that electrically couple to any of PDUs 210. In other words, power distribution portion 216 only may include those electrical components that electrically couple to any of PDUs 210.

Figure 4:
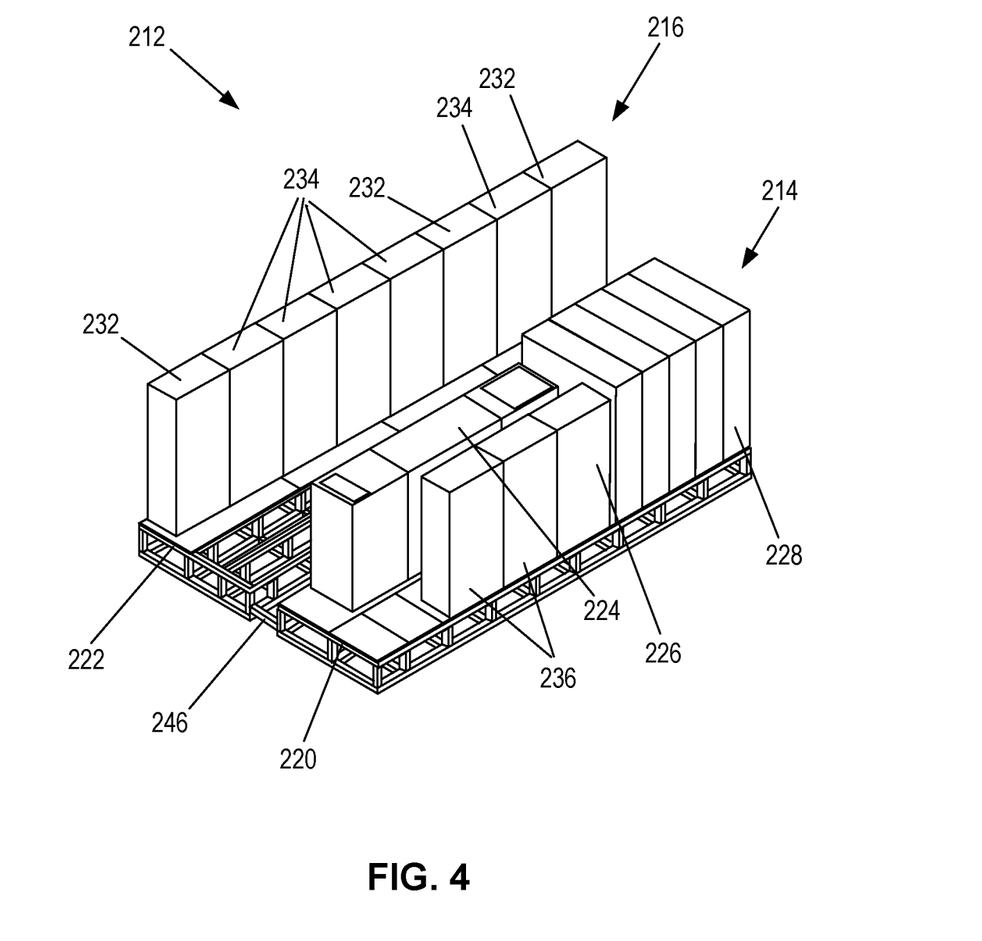
FIG. 4 is an isometric view of a power distribution module of an example data center, in accordance with techniques of the disclosure.

FIG. 4 is an isometric view of a power distribution module of an example data center, in accordance with techniques of the disclosure. As illustrated in FIG. 4, in one example, a block of power distribution module 212 of data center 201 may include one or more power supply portions 214 positioned on one or more power supply skid frames 220 and one or more power distribution portions 216 positioned on one or more power distribution skid frames 222. In one example, power supply portion 214 may include one or more uninterruptible power supplies (UPS) 224, one or more high voltage mechanical distribution (HMD) panels 226, and a main switchboard 228 to control power that is provided by power supply portion 214 to power distribution portion 216. Some examples may include a monitoring demarcation panel positioned on the power supply skid frame 220 (not show in FIG. 5). Power distribution portion 216 may include one or more UPS power distribution switchboards (UPS high voltage distribution (UHD) panels 232), and one or more static transfer switches 234 positioned on the power distribution skid frame 224 to control distribution of power received from power supply portion 216 to racks 202 within cages 204 as desired. According to one example, power supply portion 214 may include additional components to be positioned on power supply skid frame 220 for future use, such as one or more additional static transfer switches 236, for example.

Figure 5:
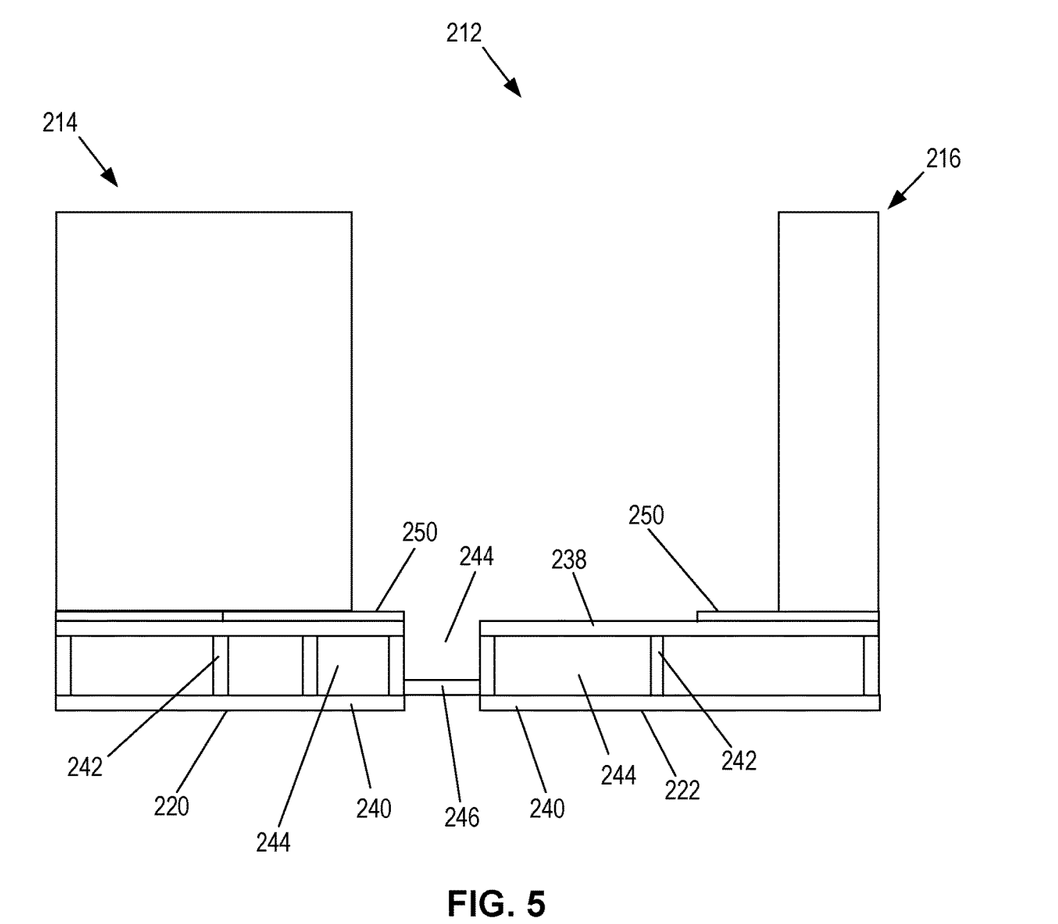
FIG. 5 is a section end view of a power distribution module of an example data center in accordance with techniques of the disclosure.

FIG. 5 is a section end view of a power distribution module of an example data center, in accordance with techniques of the disclosure. As illustrated in FIGS. 4 and 5, power supply skid frame 220 and power distribution skid frame 222 of power distribution module 212 each include a top portion 238 extending parallel to and a predetermined distance above a bottom portion 240. One or more support bars 242 may extend between the top portion 238 and bottom portion 240 of both power supply skid frame 220 and power distribution skid frame 222 to ensure that top portion 238 uniformly and evenly extends the predetermined distance from bottom portion 240 throughout power distribution module 212, and to ensure a predetermined weight tolerance throughout power supply skid frame 220 and power distribution skid frame 222, and to create a gap or opening 244 under top portion 238 of power supply skid frame 220 and power distribution skid frame 222. In addition, one or more skid frame spacer bars 246 may be positioned to extend between power supply skid frame 220 and power distribution skid frame 222 resulting in a gap or opening 244 being formed between power supply skid frame 220 and power distribution skid frame 222. Power cables, conduit, couplings, and connections may be positioned to extend within each opening 240 formed by one or more spacer bars 246, power supply skid frame 220 and power distribution skid frame 222, as described below. In addition, the one or more skid frame spacer bars 246 extending between power supply skid frame 220 and power distribution skid frame 222 mechanically couple power supply skid frame 220 and power distribution skid frame 222, preventing relative shifting of power supply skid frame 220 and power distribution skid frame 222 and to modularly form power distribution module 212, as described below. In one example, multiple, uniform-length skid frame spacers 246 may be installed along the length of the skid frames 220, 222 to mechanically couple power supply skid frame 220 to power distribution skid frame 222, using a mechanical bolt, a snap fit or locking connection, for example.

Figure 6A:
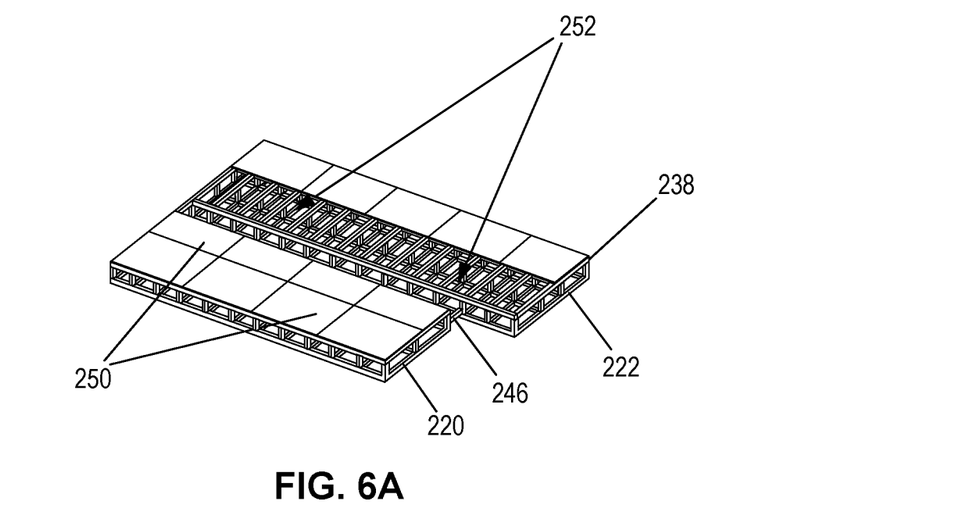
FIGS. 6A and 6B are isometric views of a power supply skid frame mechanically coupled to a power distribution skid frame in accordance with an embodiment of the present disclosure.
Figure 6B:
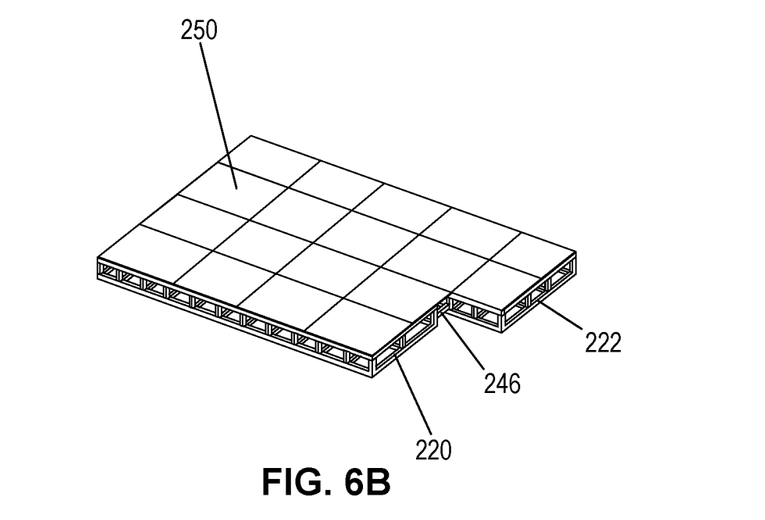

FIGS. 6A and 6B are isometric views of a power supply skid frame mechanically coupled to a power distribution skid frame in accordance with an embodiment of the present disclosure. In order to address increases in power load demands, resulting from one or a combination of increased demands associated with current customers and increased demands associated with newly added customers, a data center 201 provider may utilize modular techniques of the present disclosure to enable individual mechanical and electrical coupling of the power supply skid frame 220 and power distribution skid frame 222. As described below, a data center provider may address increased power demands by installing only one or more additional power distribution portion 216 for one block of customers and tethering the electrical capacity from power supply portion 214 to the newly installed one or more distribution portion 216.

According to the present disclosure, power supply skid frame 220, power supply portion 214, power distribution skid frame 222, power distribution portion 216, and one or more skid frame spacer bars 246 are initially presented as separate components. As illustrated in FIGS. 6A and 6B, one or more skid frame spacer bars 246 are positioned between power supply skid frame 220 and power distribution skid frame 222 to mechanically couple separated power supply skid frame 220 and power distribution skid frame 222. Removable tiles 250 may be selectively positioned over top portion 238 of each of power supple skid frame 220, power distribution skid frame 222 and skid frame spacer bars 246, as illustrated in FIG. 6A, so that a skid frame access portion 252 may be formed along top 238 of power distribution skid frame 222 and the one or more skid frame spacer bars 246. Skid frame access portion 258 enables access for forming electrical coupling of power distribution portion 216 and power supply portion 214, as described below, once power distribution portion 216 or both power distribution portion 216 and power supply portion 214 are positioned on respective power distribution skid frame 222 and power supply skid frame 220. Once electrical coupling has been completed, additional tiles 250 may be positioned over skid frame access portion 252, as illustrated in FIG. 6B, to conceal the electrical coupling positioned within opening 244 formed by power distribution skid frame 222, power supply skid frame 220 and the one or more skid frame spacer bars 246, and to enable data center 201 personnel to walk along installed tiles 250.

It is understood that while power supply skid frame 220 and power distribution skid frame 222 are shown in FIGS. 4, 5, 6A and 6B being mechanically coupled by one or more skid frame spacer bars 246, power supply skid frame 220, power distribution skid frame 222, and skid frame spacer bars 246 are separate modular components prior to such assembly. In this way, according to an example of the disclosure, in order to provide electrical power to multiple customer devices within data center 212, one or more skid frame spacer bars 246 may be positioned between and mechanically couple power supply skid frame 220 and power distribution skid frame 222 within power distribution module 212. Power supply portion 214 may then be positioned on top portion 238 of power supply skid frame 220 and power distribution portion 216 may be positioned on top portion 238 of power distribution skid frame 222. A manufacturer may manufacture power supply portion 214 and power supply skid frame 220 by, in part, positioning power supply portion 214 on top portion 238 of power supply skid frame 220 and, in some cases, electrically coupling components of power supply portion 214 underneath top portion 238 prior to delivering power supply skid frame 220 and power supply portion 214 fully-assembled to a data center for installation. Likewise, a manufacturer may manufacture power distribution portion 216 and power distribution skid frame 222 by, in part, positioning power distribution portion 216 on top portion 238 of power distribution skid frame 222 and, in some cases, electrically coupling components of power distribution portion 216 underneath top portion 238 prior to delivering power distribution skid frame 222 and power distribution portion 216 fully-assembled to a data center for installation.

According to another example, an apparatus to provide electrical power to multiple customer devices within data center 212 may include power supply skid frame 220 having top portion 238 and bottom portion 240, power supply portion 214 physically separate from power supply skid frame 220 and capable of being positioned on top portion 238 of power supply skid frame 220 to supply the electrical power, and one or more skid frame spacer bars 246, mechanically separate from power supply skid frame 220 and capable of being mechanically coupled to power supply skid frame 220. According to another example, an apparatus to provide electrical power to multiple customer devices within data center 212 may include power distribution skid frame 222 having top portion 238 and bottom portion 240, power distribution portion 216 physically separate from power distribution skid frame 222 and capable of being positioned on top portion 238 of power distribution skid frame 222, and one or more skid frame spacer bars 246 capable of being mechanically coupled to power distribution skid frame 222.

Figure 7:
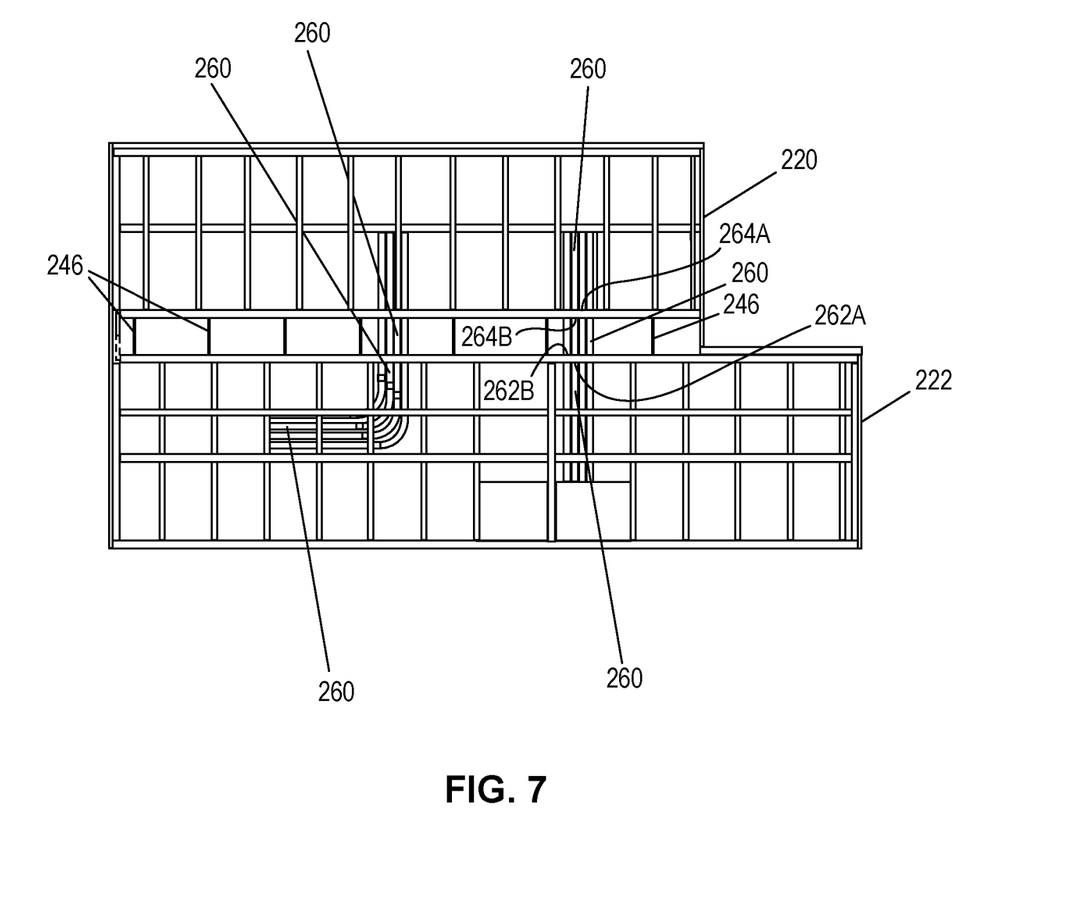
FIG. 7 is a schematic diagram of a bottom planar view of electrical coupling within a power supply skid frame and a power distribution skid frame in accordance with an embodiment of the present disclosure.

FIG. 7 is a schematic diagram of a bottom view of electrical and mechanical coupling of a power supply skid frame and a power distribution skid frame in accordance with an embodiment of the present disclosure. As illustrated in FIG. 7, one or more connection 260, which may include power cables and/or conduit, may be positioned within opening 244 formed by power supply skid frame 220, power distribution skid frame 224, and one or more skid frame spacer bars 246 to subsequently provide electrical connection between power supply portion 214 and power distribution portion 216 once power supply portion 214 and power distribution portion 216 are positioned on respective power supply skid frame 220 and power distribution skid frame 222. In accordance with an example of the present disclosure, one or more ends of connections 260 positioned within opening 244 formed by power distribution skid frame 222 may include connection points 262A that align with connection points 262B positioned at one or more ends of connections 260 positioned within opening 244 formed by one or more spacer bars 246. In the same way, one or more ends of connections 260 positioned within opening 244 formed by power supply skid frame 220 may include connection points 264A that align with connection points 264B positioned at one or more ends of connections 260 positioned within opening 244 formed by one or more spacer bars 246. In this way, connections 260 of power distribution skid frame 222 and power supply skid frame 220 may be mechanically and/or electrically coupled by connections 260 positioned within opening 240 formed by one or more skid frame spacer bars 246 via connection points 262A/262B and 264A/264B, respectively.

Figure 8:
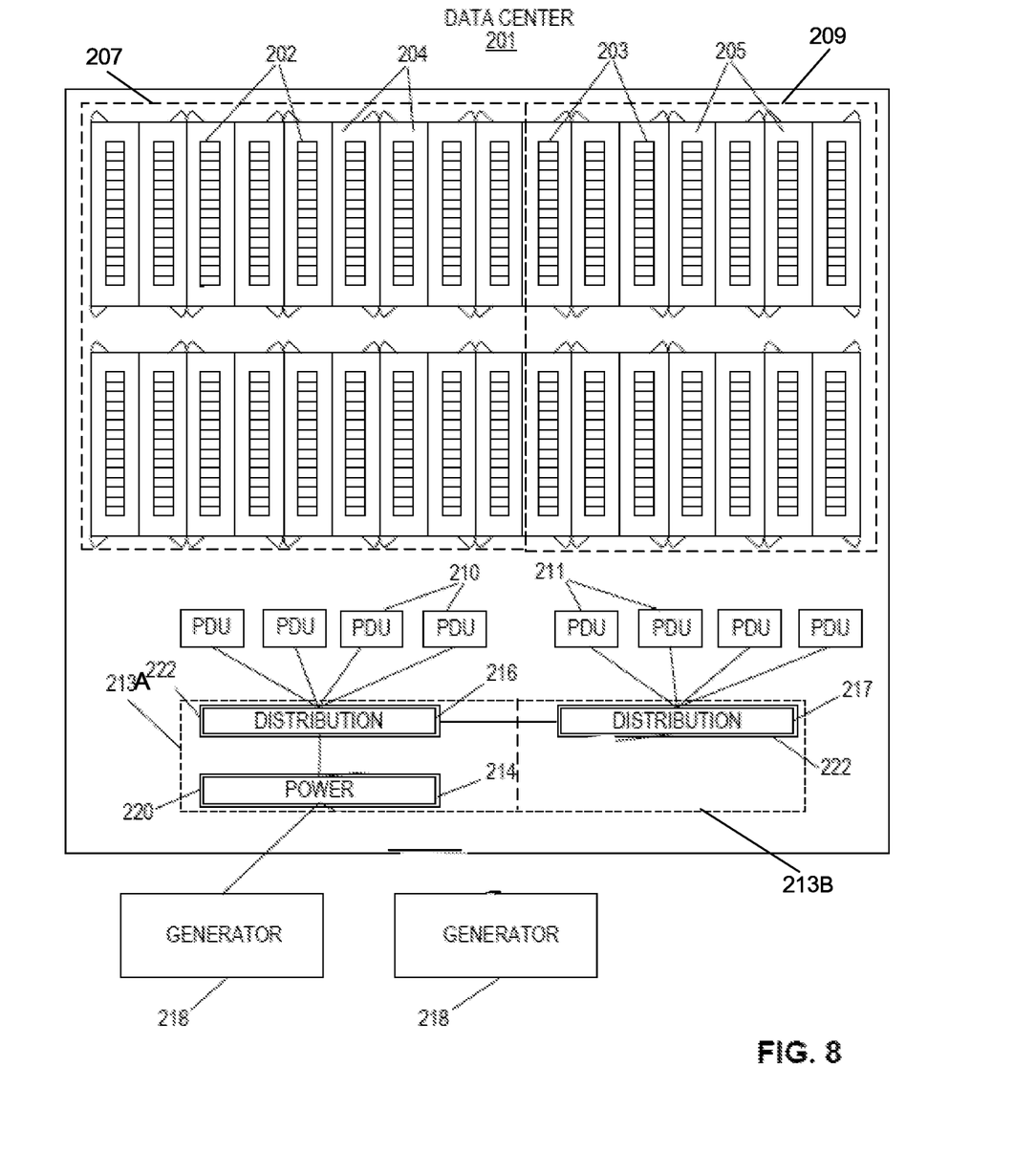
FIG. 8 is a block diagram of an example data center, in accordance with techniques of the disclosure.
Figure 9:
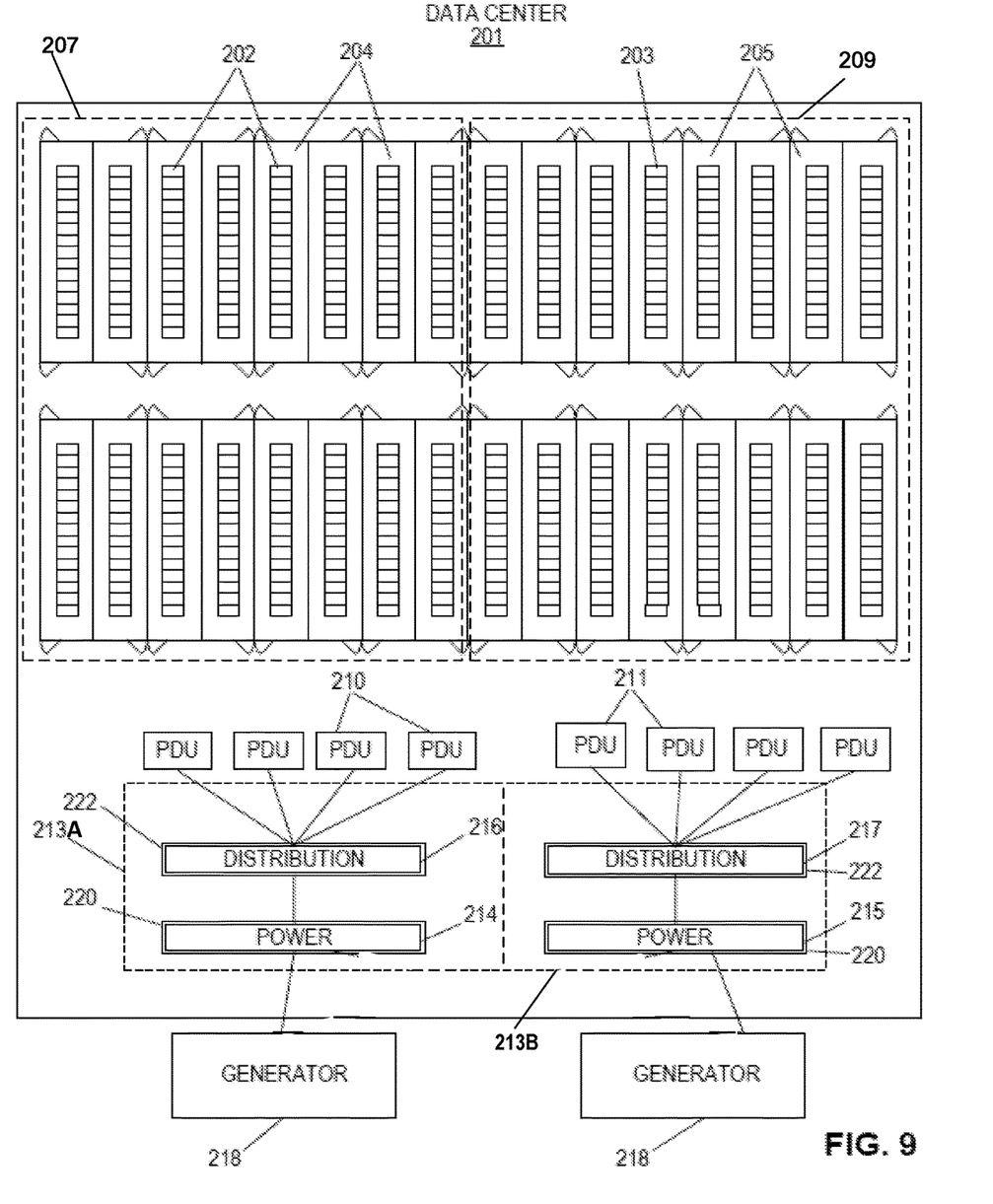
FIG. 9 is a block diagram of an example data center in accordance with techniques of the disclosure.

FIG. 8 is a block diagram of an example data center, in accordance with techniques of the disclosure. By utilizing the modular techniques of the present disclosure to enable individual manufacturing, deployment, and mechanical coupling of the power supply skid frame 220 and power distribution skid frame 222, the present disclosure enables data center 201 to incrementally and more quickly address increases in required power distribution and/or supply capacity as the number of newly added customers and/or the load associated with the number of current customer devices within data center 201 increase. For example, as illustrated in FIGS. 4 and 9, data center 201 may update modular power distribution module 212 of the present disclosure to provide power distribution components for distributing power to devices within the facility. For example, data center 201 may determine a newly required power distribution and/or power supply capacity that occurs as a result of the addition of an additional hall 209, based on at least one of spatial distribution of power loads in the data center and a determined load requirements for the computing and mechanical (e.g., HVAC, lighting) equipment in the data center. Based on the determined newly required power capacity, a data center 201 provider may determine whether to expand power distribution module 212 by merely adding a block to power distribution module 212 having only an additional power distribution portion 216 to power the additional hall 209 without adding an additional power supply portion 214 to the block, or by adding both an additional power supply portion 214 and power distribution portion 216 to provide an updated power distribution module 213B.

In particular, as illustrated in FIG. 8, in one example, based on determined required additional power distribution capacity resulting from the newly added hall 209 to the data center 201, data center 201 may electrically couple only an additional power distribution skid frame 222 having power distribution portion 217 positioned thereon to the current power distribution module 212 (FIG. 3), forming a first distribution module 213A and a second distribution module 213B, along with additional PDUs 211, to incrementally and more quickly address increases in required power capacity resulting from the newly added hall 209. The added power distribution portion 217 includes switch gear to receive power from power supply portion 214 through power distribution portion 222 via power cables and connections 260 extending within opening 244 of power distribution skid frame 222 and newly added power distribution skid frame 222 having power distribution portion 217 positioned thereon. Power may be distributed via PDUs 211 to additional loads resulting either from additional demands from current customer cages 204 and/or from additional demands associated with new customer cages 205 within added hall 209 resulting from the addition of newly acquired customers to the data center 201 or expansion of existing customers or enterprise demands.

In this way, according to an example of the disclosure, in order to provide electrical power to multiple customer devices within data center 212, one or more skid frame spacer bars 246 may be positioned between and mechanically couple power supply skid frame 220 and a first power distribution skid frame 222 to form a first block within power distribution module 213A. Power supply portion 214 may be positioned on top portion 238 of power supply skid frame 220 and a first power distribution portion 216 may be positioned on the first power distribution skid frame 222. A second power distribution skid frame 222 may be positioned within power distribution module 213B to form a second block mechanically separated from the first block within the power distribution module 213A, and a second power distribution portion 217 may be positioned on the second power distribution skid frame 222. Second power distribution portion 217 may be electrically coupled to the power supply portion 214 on the first power supply skid frame 220 via power distribution portion 216 to expand electrical power delivered to the customer devices within hall 209 without providing an additional power supply skid frame 220 to the power distribution module 213B.

FIG. 9 is a block diagram of an example data center, in accordance with techniques of the disclosure. As illustrated in FIG. 9, in one example, subsequent to having mechanically coupled only an additional power distribution portion 217 (FIG. 8) to the current power distribution module 212 (FIG. 3) to address additional power demands from current customer cages 204 and/or from further newly acquired customers to the data center 201 located in the added hall 209, data center 201 may continue to assess power needs. In one example, as subsequent power demands increase, data center 201 may determine a further need for more additional power to address new current power demands within hall 209. In response to the newly acquired power demands, data center 201 may make a determination to position an additional power supply skid frame 220 having an additional power supply portion 215 positioned thereon to the current power distribution module 213B, as illustrated in FIG. 9. Data center 201 provider mechanically couples the currently added power supply skid frame 220 to previously positioned power distribution skid frame 217 using one or more skid frame spacer bars 246, as described above. Power supply portion 215 may be positioned on top portion 238 of power supply skid frame 220. Power cables and connections 260 of newly added power supply skid frame 220 and power distribution portion 217 positioned within opening 244 are connected at connection points 262A/B and 264A/B, as described above, to electrically and/or mechanically couple newly added power supply portion 217 to previously added power distribution portion 217, thereby enabling increase in power supplied to power distribution portion 217. The data center 201 provider may also position further additional PDUs 211 in addition to the additional power supply portion 215 to supply additional power to address determined increases in required power capacity. Power distribution portion 217 may include switch gear to receive power from power supply portion 215 and distribute power via PDU's 211 to additional loads resulting either from additional demands from current customer cages 204 and/or from additional demands from new customer cages 205 resulting from the addition of newly acquired customers within added hall 209 to the data center 201.

In this way, according to an example of the disclosure, a method of providing electrical power to multiple customer devices within data center 212 may include positioning one or more skid frame spacer bars 246 between and mechanically coupling power supply skid frame 220 and a first power distribution skid frame 222 to form a first block within power distribution module 213A. Power supply portion 214 may be positioned on top portion 238 of power supply skid frame 220 and a first power distribution portion 216 may be positioned on the first power distribution skid frame 222. A second power distribution skid frame 222 may be positioned within power distribution module 213B to form a second block mechanically separate from the first block within the power distribution module 213A, and a second power distribution portion 217 may be positioned on the second power distribution skid frame 222. The second power distribution portion 217 may be electrically coupled to the power supply portion 214 on the first power supply skid frame 220 via power distribution portion 216 to expand electrical power delivered to the customer devices without providing an additional power supply skid frame 220 to the power distribution module 212 (FIG. 8). A second power supply skid frame 220 may subsequently be positioned within the second block of the power distribution module 213B, and a second power supply portion 215 may be positioned on the second power supply skid frame 220 to supply the electrical power received either from a power supply company and distributed via a transformer, or from a generator 218. On or more additional skid frame spacer bars 246 may be positioned between the second power supply portion 215 and the second distribution portion 217 to mechanically couple the second power supply skid frame 220 to the second power distribution skid frame 222, and second power supply portion 215 may be electrically coupled to the second power distribution portion 217, as described above.

In another embodiment, in response to the newly acquired power demands, data center 201 may make a determination to mechanically couple, as described above, both an additional power distribution skid frame 222 having power distribution portion 217 to be positioned thereon and an additional power supply skid frame 220 having an additional power supply portion 215 to be positioned thereon to the current power distribution module 213B (FIG. 9). The additional power supply skid frame 220 and additional power distribution skid frame 222 may be mechanically couple by an additional one or more skid frame spacer bars 246. The additional power supply portion 215 and additional power distribution portion 217 may be electrically and/or mechanically coupled via connection points 262A/B and 264A/B of connections 260 extending within opening 242, along with further additional PDUs 211 to address determined increases in required power capacity resulting from the newly added hall 209. Power distribution portion 217 may include switch gear to receive power from power supply portion 214 and distribute power via PDU's 211 to additional loads resulting either from additional demands from current customer cages 204 and/or from additional demands from new customer cages 205 resulting from the addition of newly acquired customers to data center 201 within hall 209.

In this way, by providing one or more redundant power distribution skid frames 222, or by providing both one or more power distribution frames 222 and power supply skid frames 220 using the methods described above, the present disclosure enables data center 201 to incrementally and more quickly address increases in required power capacity as the number of customers and/or the load associated with the number of customer devices within data center 201 increase. The modular capabilities of the present disclosure enable data center 201 to expand consistently in a ramping load pattern, and allows data center 201 to defer adding one or more additional power source portion 214 to power distribution module 212 until needed, while only increasing power distribution resources by adding only power distribution portion 216, improving efficiency. By splitting the skid frame design to include separate power skid frame 220 and power distribution skid frame 222, along with separate one or more skid frame spacer bars 246, the present disclosure enables data center 201 to install only power distribution portion 216 for one block of power distribution module 212 and tether the electrical capacity from another block of power distribution module 212, enabling the electrical capacity to be spread across a much wider field without adding an additional power supply portion 214 to power distribution module 212 until needed.

Various examples of the disclosure have been described. Any combination of the described systems, operations, or functions is contemplated. These and other examples are within the scope of the following claims.

What is claimed is:

1. A system for providing electrical power to computing devices within a data center, comprising:
   a power supply skid frame having a top portion, and a bottom portion;
   a power supply portion physically separate from the power supply skid frame and capable of being positioned on the top portion of the power supply skid frame to supply the electrical power;
   a first power distribution skid frame, mechanically and electrically separate from the power supply skid frame, having a top portion, and a bottom portion;
   a first power distribution portion physically separate from the first power distribution skid frame and capable of being positioned on the top portion of first power distribution skid frame to distribute the electrical power; and
   one or more skid frame spacer bars, physically separate from the power supply skid frame and the first power distribution skid frame and capable of mechanically coupling the power supply skid frame and the first power distribution skid frame,
   wherein the skid frame spacer bars, when installed, define a gap between the power supply skid frame and the first power distribution skid frame to accommodate conduits between the power supply skid frame and the first power distribution skid frame.

2. The system of claim 1, further comprising:
   one or more support bars extending from the bottom portion of the power supply skid frame to the top portion of the power supply skid frame to form a first opening between the bottom portion of the power supply skid frame and the top portion of the power supply skid frame;
   first connections positioned within the first opening;
   one or more support bars extending from the bottom portion of the first power distribution skid frame to the top portion of the first power distribution skid frame to form a second opening between the bottom portion of the first power distribution skid frame and the top portion of the first power distribution skid frame; and
   second connections positioned within the second opening, wherein the first connections and the second connections are positioned to align when the power supply skid frame is mechanically coupled to the first power distribution skid frame by the one or more skid frame spacer bars.

3. The system of claim 2, further comprising:
   third connections positioned within the gap between the power supply skid frame and the first power distribution skid frame;

connection points formed at ends of the first connections, the second connections, and the third connections, wherein the connection points formed at ends of the third connections couple with the connections points formed at ends of the first connections and the second connections when the power supply skid frame is coupled to the first power distribution skid frame by the one or more skid frame spacer bars.

4. The system of claim 1, further comprising:
one or more support bars extending from the bottom portion of the first power distribution skid frame to the top portion of the first power distribution skid frame to form an opening between the bottom portion of the first power distribution skid frame and the top portion of the first power distribution skid frame, wherein at least a part of the top portion of the first power distribution skid frame defines a skid frame access portion to provide access to the opening; and
removable tiles capable of being positioned over the access portion.

5. The system of claim 1, further comprising:
one or more support bars extending from the bottom portion of the first power distribution skid frame to the top portion of the first power distribution skid frame to form a first opening between the bottom portion of the first power distribution skid frame and the top portion of the first power distribution skid frame, wherein at least a part of the top portion of the first power distribution skid frame and a second opening formed between the power supply skid frame and the first power distribution skid frame by the one or more skid frame spacer bars define a skid frame access portion to provide access to the first opening and the second opening; and
removable tiles capable of being positioned over the access portion.

6. The system of claim 1, wherein the power supply portion comprises:
one or more uninterruptible power sources;
one or more HMD panels;
one or more static transfer switches;
a main switchboard; and
a monitoring demarcation panel.

7. The system of claim 1, wherein the first power distribution portion comprises:
one or more UHD panels; and
one or more static transfer switches.

8. The system of claim 1, further comprising one or more power distribution units electrically coupled to the first power distribution portion to deliver power to the computing devices.

9. The system of claim 1, further comprising:
a second power distribution skid frame having a top portion and a bottom portion; and
a second power distribution portion capable of being positioned on the top portion of the second power distribution skid frame and being electrically coupled to the power supply portion to further distribute the generated power to the computing devices, wherein the second power distribution skid frame is not mechanically coupled to the power supply skid frame or to the first power distribution skid frame.

10. An apparatus for providing electrical power to computing devices within a data center, comprising:
a power supply skid frame having a top portion and a bottom portion;
a power supply portion physically separate from the power supply skid frame and capable of being positioned on the top portion of the power supply skid frame to generate the electrical power; and
one or more skid frame spacer bars, mechanically separate from the power supply skid frame, and capable of being mechanically coupled to the power supply skid frame, wherein the skid frame spacer bars, when installed, define a gap between the power supply skid frame and a first power distribution skid frame to provide access to connection points of the power supply skid frame.

11. The apparatus of claim 10, further comprising:
one or more support bars extending from the bottom portion to the top portion of the power supply skid frame to form an opening under the top portion of the power supply skid frame;
first connections positioned within the first opening;
second connections positioned within the gap formed by the one or more skid frame spacer bars when the one or more skid frame spacer bars are mechanically coupled to the power supply skid frame,
wherein the connection points are formed at ends of the first connections and the second connections, wherein the connection points couple the first connections and the second connections when the one or more skid frame spacer bars are mechanically coupled to the power supply skid frame.

12. The apparatus of claim 10, further comprising:
removable tiles capable of being positioned over the gap.

13. The apparatus of claim 10, wherein the power supply portion comprises:
one or more uninterruptible power sources;
one or more HMD panels;
one or more static transfer switches;
a main switchboard; and
a monitoring demarcation panel.

14. The apparatus of claim 13, wherein the power supply portion further comprises one or more additional static transfer switches.

15. An apparatus for providing electrical power to computing devices within a data center, comprising:
a power distribution skid frame having a top portion and a bottom portion;
a power distribution portion physically separate from the power distribution skid frame and capable of being positioned on the top portion of power distribution skid frame; and
one or more skid frame spacer bars, mechanically separate from the power distribution skid frame, and capable of being mechanically coupled to the power distribution skid frame; and
wherein the skid frame spacer bars, when installed, define a gap between the power supply skid frame and the first power distribution skid frame to accommodate conduits between the power supply skid frame and the first power distribution skid frame.

16. The apparatus of claim 15, further comprising:
one or more support bars extending from the bottom portion to the top portion of the power distribution skid frame to form an opening under the top portion of the power distribution skid frame;
first connections positioned within the first opening;
second connections positioned within an opening formed by the one or more skid frame spacer bars when the one or more skid frame spacer bars are mechanically coupled to the power distribution skid frame;

connection points formed at ends of the first connections and the second connections, wherein the connection points couple the first connections and the second connections when the one or more skid frame spacer bars are mechanically coupled to the power distribution skid frame.

17. The apparatus of claim 15, further comprising:

one or more support bars extending from the bottom portion of the power distribution skid frame to the top portion of the power distribution skid frame to form an opening between the bottom portion of the power distribution skid frame and the top portion of the power distribution skid frame, wherein at least a part of the top portion of the power distribution skid frame defines a skid frame access portion to provide access to the opening; and removable tiles capable of being positioned over the skid frame access portion.

18. The apparatus of claim 15, further comprising:

one or more support bars extending from the bottom portion of the power distribution skid frame to the top portion of the power distribution skid frame to form a first opening between the bottom portion of the power distribution skid frame and the top portion of the power distribution skid frame, wherein at least a part of the top portion of the power distribution skid frame and a second opening formed by the one or more skid frame spacer bars define a skid frame access portion to provide access to the first opening and the second opening; and removable tiles capable of being positioned over the skid frame access portion.

19. The apparatus of claim 15, wherein the power distribution portion comprises:

one or more UHD panels; and
one or more static transfer switches.

20. The apparatus of claim 19, further comprising one or more power distribution units to be electrically coupled to the power distribution portion to deliver power to the customer devices.

21. A method comprising:

positioning a power supply skid frame having a top portion and a bottom portion within a data center;

positioning a first power distribution skid frame having a top portion and a bottom portion within the data center;

mechanically coupling the power supply skid frame and the first power distribution skid frame with one or more skid frame spacer bars along respective lengths of the power supply skid frame and the first power distribution skid frame to define a gap between the power supply skid frame and the first power distribution skid frame to provide access to connection points formed at the ends of connections of the power supply skid frame and the first power distribution skid frame; and electrically coupling a power supply portion positioned on the top portion of the power supply skid frame and a first power distribution portion positioned on the top portion of the first power distribution skid frame.

22. The method of claim 21, further comprising:

positioning a second power distribution skid frame having a top portion and a bottom portion within the data center; and electrically coupling the power supply portion positioned on the top portion of the power supply skid frame and a second power distribution portion positioned on the top portion of the second power distribution skid frame, wherein the second power distribution skid frame is not mechanically coupled to the power supply skid frame or to the first power distribution skid frame.

23. The method of claim 22, wherein the power supply portion positioned on the top portion of the power supply skid frame is electrically coupled to the second power distribution portion positioned on the top portion of the second power distribution skid frame via the first power first power distribution portion.

* * * * *